United States Patent
Senda

(10) Patent No.: US 7,908,539 B2
(45) Date of Patent: Mar. 15, 2011

(54) PARITY CHECK MATRIX GENERATION METHOD, DATA TRANSMISSION SYSTEM, ENCODING DEVICE, DECODING DEVICE, AND A PARITY CHECK MATRIX GENERATION PROGRAM

(75) Inventor: Yuzo Senda, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 12/436,589

(22) Filed: May 6, 2009

(65) Prior Publication Data

US 2009/0217132 A1    Aug. 27, 2009

Related U.S. Application Data

(62) Division of application No. 10/586,541, filed as application No. PCT/JP2005/000471 on Jan. 17, 2005, now Pat. No. 7,802,162.

(30) Foreign Application Priority Data

Jan. 20, 2004    (JP) ................................ 2004-011923

(51) Int. Cl.
   *H03M 13/00*  (2006.01)
(52) U.S. Cl. .................. 714/752; 714/755; 714/804
(58) Field of Classification Search .................. 714/752, 714/755, 801, 758, 804, 746, 792, 799
See application file for complete search history.

(56) References Cited

U.S. PATENT DOCUMENTS

| 6,718,508 | B2* | 4/2004 | Lodge et al. ................... 714/780 |
| 6,789,227 | B2* | 9/2004 | De Souza et al. ............. 714/804 |
| 6,850,936 | B2* | 2/2005 | Oyanagi et al. ........................ 1/1 |
| 7,298,785 | B2* | 11/2007 | Suzuki ........................... 375/260 |
| 7,395,484 | B2* | 7/2008 | Matsumoto ................... 714/758 |
| 7,516,388 | B2* | 4/2009 | Matsumoto ................... 714/752 |

FOREIGN PATENT DOCUMENTS

| JP | 2001-168733 A | 6/2001 |
| JP | 2003-115768 A | 4/2003 |
| JP | 2003-198383 A | 7/2003 |

(Continued)

OTHER PUBLICATIONS

Matsumoto et al. "Irregular Low-Density Parity-Check Code Design Based on Euclidean Geometries" IEICE Transactions on Fundamentals. Jul. 2003, pp. 1820-1834, vol. E86-A, No. 7, Tokyo, Japan.

(Continued)

*Primary Examiner* — Fritz Alphonse
(74) *Attorney, Agent, or Firm* — Sughrue Mion, PLLC

(57) ABSTRACT

A method that allows the easy generation of low-density parity-check codes that can realize superior error-correcting characteristics. A processor (50) of a transmission line encoder constructs parity check matrix H from partial matrix H1 of m rows and k columns on the left side and partial matrix H2 of m rows and m columns on the right side. The processor (50) generates partial matrix H2 as a unit matrix. The processor (50) generates partial matrix H1 to satisfy the conditions that, when any two rows contained in partial matrix H1 are selected, the two rows have periods that are relatively prime, or when the periods are identical, the two rows have different phases. The processor (50) then joins partial matrix H1 and partial matrix H2 to generate parity check matrix H.

14 Claims, 8 Drawing Sheets

FOREIGN PATENT DOCUMENTS

| JP | 2003-244109 A | 8/2003 |
|---|---|---|
| JP | 2003-296302 A | 10/2003 |
| WO | 01/97387 A | 12/2001 |

OTHER PUBLICATIONS

Matsumoto et al. "Irregular low-density parity-check code design based on integer lattices" Proceedings 2003 IEEE International., Jun. 29-Jul. 4, 2003, p. 3, New York, NY XP010657031.

Lehmann et al. "Distance properties of irregular ldpc codes" Proceedings 2003 IEEE.

Tian et al. "Construction of irregular LDPC codes with low error floors" IC 2003. 2003 IEEE International, May 11-15, 2003, New York, NY, vol. 4 pp. 3125-3129 XP010643022.

Yang et al. "Design of efficiently encodable moderate-length high-rate irregular LDPC codes" Proceedings of the annual conference on communication, control and computing, Oct. 2002 pp. 1415-1424 XP 009042018.

Luby et al. "Improved low-density parity-check codes using irregular graphs and belief propagation" information theory, 1998. Proceedings. Cambridge, MA, p. 117 XP 010297081.

Rosenthal et al. "Constructions of regular and irregular LDPC codes using Ramanujan graphs and ideas from margulis" Proceedings of the 2001 IEEE International Symposium on information theory. Jun. 2001 p. 4 New York, NY XP 010552621.

Mannoai et al. "Optimized irregular gallager codes for OFDM transmission" Personal, indoor and mobile radio communications, 2002. vol. 1 pp. 222-226 XP010614219.

Echard et al. "Irregular/spl pi/-rotation LDPC codes" Globecom 02. IEEE Global Telecommunications Conference, New York, NY vol. 2, Nov. 2002 pp. 1274-1278 XP010636350.

Jeongseok et al. "Optimal puncturing of irregular low-density parity-check codes" IEEE International Conference on Communications, New York, NY vol. 5 May 2003 pp. 3110-3114 XP010643019.

Kasai et al. "Detailed representation of irregular ldpc code ensembles and density evolution" IEEE International Symposium on Information Theory, New York, NY Jun. 2003 p. 121 XP010657149.

Yang et al. "Lowering the error-rate floors of moderate-length high-rate irregular ldpc codes" IEEE international symposium on information theory, New York, NY Jun. 2003 p. 237 XP010657265.

Rashidpour et al. "Low-density parity-check codes with simple irregular semi-random parity-check matrix for finite-length applications" Personal, indoor and mobile radio communications, 2003. PIMRC 2003. 14th IEEE Proceedings, Sep. 2003 pp. 439-443.

Liuguo et al. "Modified belief-propagation algorithm for decoding of irregular low-density parity-check codes" Electronics letters, vol. 38, No. 24, Nov. 2002 pp. 1551-1553 XP 006019345.

Johnson et al. "A family of irregular ldpc codes with low encoding complexity" IEEE Communications letters, IEEE Service Center, Piscataway, NJ vol. 7, No. 2, Feb. 2003 XP011066488.

Michael G. Luby et al. "Efficient Erasure Correcting Codes" IEEE Transactions on Information Theory, vol. 47, No. 2, Feb. 2001, pp. 569-584.

Thomas J. Richardson et al. "Design of Capacity-Approaching Irregular Low-Density Parity-Check Codes" IEEE Transactions on Information Theory, vol. 47, No. 2, Feb. 2001, pp. 619-637.

David J.C. Mackay "Good Error-Correcting Codes Based on Very Sparse Matrices" IEEE Transactions on Information Theory, vol. 45, No. 2, Mar. 2, 1999, pp. 399-431.

\* cited by examiner

Fig. 1
(RELATED ART)
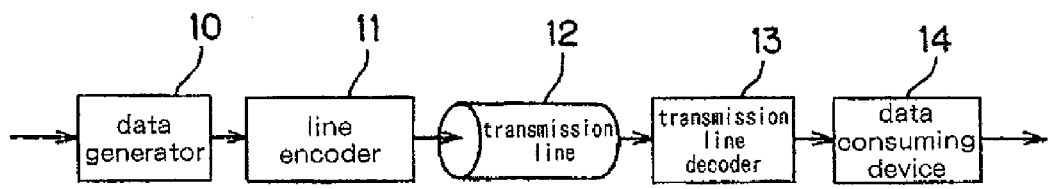
Fig. 2
(RELATED ART)
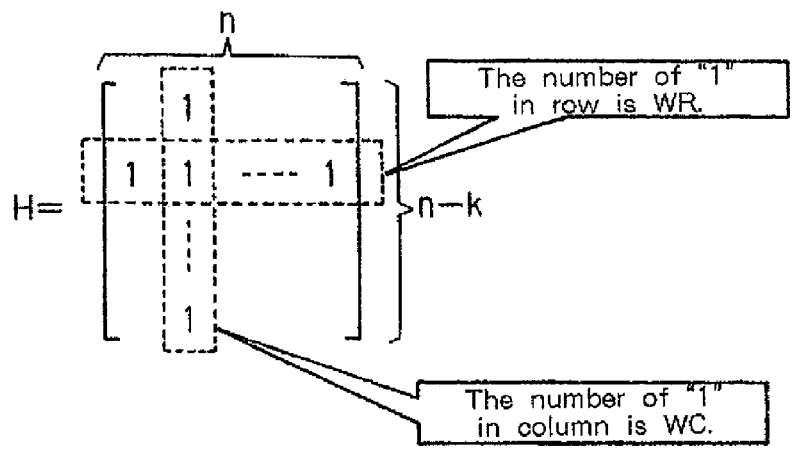
Fig. 3A
(RELATED ART)
$$H = \begin{bmatrix} 1 & 1 & 1 & 1 & 0 & 1 & 1 & 0 & 0 & 0 \\ 0 & 0 & 1 & 1 & 1 & 1 & 1 & 1 & 0 & 0 \\ 0 & 1 & 0 & 1 & 0 & 1 & 0 & 1 & 1 & 1 \\ 1 & 0 & 1 & 0 & 1 & 0 & 0 & 1 & 1 & 1 \\ 1 & 1 & 0 & 0 & 1 & 0 & 1 & 0 & 1 & 1 \end{bmatrix}$$

variable nodes    check nodes

Fig. 8 period4
lower triangular matrix   period5
(Other elements than "1" are "0")

PARITY CHECK MATRIX GENERATION METHOD, DATA TRANSMISSION SYSTEM, ENCODING DEVICE, DECODING DEVICE, AND A PARITY CHECK MATRIX GENERATION PROGRAM

This is a Divisional Application of U.S. application Ser. No. 10/586,541 filed Jul. 19, 2006, now U.S. Pat. No. 7,802, 162, which claims priority from PCT Application No. PCT/JP2005/000471 filed Jan. 17, 2005, and from Japanese Patent Application No. 2004-011923 filed Jan. 20, 2004, which applications are incorporated herein by reference.

TECHNICAL FIELD

The present invention relates to a parity check matrix generation method and parity check matrix generation program by which an encoder (encoding device) and a decoder (decoding device), which use LDPC (Low-Density Parity-Check) codes as error-correcting codes, generate a parity check matrix; and to a data transmission system, an encoding device and a decoding device that apply the parity check matrix generation method and parity check matrix generation program.

BACKGROUND ART

Error-correcting codes are typically used when transmitting data by way of transmission lines in which transmission errors may occur. FIG. 1 is a block diagram showing an example of the configuration of a data transmission system in which data are transmitted by way of a transmission line. For example, the data transmission system shown in FIG. 1 is provided with transmission line encoder 11 on the transmitting side and transmission line decoder 13 on the receiving side by way of transmission line 12. Using transmission line encoder 11 and transmission line decoder 13 to implement error correction eliminates the effect of transmission errors upon data that are sent from data generator 10 and to data consuming device 14.

Reed-Solomon codes and Turbo codes are known error-correcting codes. In addition, LDPC codes that exhibit capabilities that approach logic limits (Shannon limits) are receiving attention in recent years as error-correcting codes.

If k is the message length of messages (data) that have undergone LDPC encoding and n is the codeword length following encoding, parity check matrix H of LDPC code can be represented as a matrix of (n−k) rows and n columns. If the messages are $S=(s1, s2, \ldots, sk)$ and the codewords are $C=(c1, c2, \ldots, cn)$, codewords C are obtained by multiplying generator matrix G of k rows and n columns by message S. In other words, codewords C are obtained by finding C=SG. Since all codewords C satisfy the condition HCt=0, GHt=0. Further, Ct indicates the transposed vector of codeword C, and Ht indicates the transposed matrix of parity check matrix H.

As an example of the application of LDPC code, Non-patent Document 1 describes an example of the application of LDPC codes as a countermeasure for packet loss that occurs in a packet exchange network in which packet series is subjected to LDPC encoding.

The error-correcting characteristics of LDPC codes are determined by a parity check matrix. Non-patent Document 2 discloses a logical analysis of the error-correcting characteristics of LDPC codes. According to Non-patent Document 2, the error-correcting characteristics of LDPC codes are chiefly determined by the weighting distribution of the parity check matrix. The parity check matrix is almost entirely made up from element "0" but contains sporadic elements "1." Weighting indicates the number of elements "1" that are contained in each row and each column in the parity check matrix.

The parity check matrix proposed by Robert G. Gallager, the originator of LDPC codes, is a matrix in which the weighting of rows and columns is uniform. LDPC codes according to the parity check matrix proposed by Robert G. Gallager are referred to as "regular" LDPC codes. FIG. 2 is an explanatory view showing an example of a parity check matrix of regular LDPC code. In the parity check matrix shown in FIG. 2, the weighting of each row, i.e., the number of elements "1," is fixed (uniform) at WR, and the weighting of each column, i.e., the number of elements "1," is fixed (uniform) at WC.

In contrast, Non-patent Document 2 clearly shows that LDPC codes according to a parity check matrix in which weighting is non-uniform and that has a specific distribution have better error-correcting characteristics than regular LDPC codes. LDPC codes realized by a parity check matrix in which weighting is non-uniform and that has a specific distribution are referred to as irregular LDPC codes.

As a method of generating a parity check matrix having an optimum weighting distribution, Patent Document 1 describes an LDPC code parity check matrix generation method in which a parity check matrix is generated based on encoding rate. In the LDPC code parity check matrix generation method described in Patent Document 1, a linear programming method is used to determine the weighting distribution. Then, after determining the number of elements "1" per row and column, a parity check matrix is generated by using pseudo-random numbers to put in the positions of elements "1."

The error-correcting characteristics of the parity check matrix are not determined merely by the weighting distribution of rows and columns. Even given the optimum weighting distribution of rows and columns of a parity check matrix, it is known that, when the parity check matrix is represented using a bipartite graph (Tanner Graph), the occurrence of short loops having a length of 4 on the bipartite graph results in a drastic degradation of the error-correcting characteristics.

FIGS. 3A and 3B are explanatory views showing an example of a bipartite graph corresponding to a parity check matrix. FIG. 3A shows an example of a parity check matrix, and FIG. 3B shows a bipartite graph that represents the parity check matrix shown in FIG. 3A. In FIG. 3B, variable nodes correspond to each bit of a codeword, and check nodes correspond to each row of the parity check matrix. In addition, the edges that join the nodes represent elements "1" in the parity check matrix. As shown in FIGS. 3A and 3B, loops having a length of 4 will occur in a bipartite graph when there are two or more columns (common columns) having elements "1" shared between any two rows in the parity check matrix.

The decoding of LDPC codes is typically carried out by using a sum-product decoding method to estimate the original message based on codewords in which errors are superposed. If no loops occur in the parity check matrix, the sum-product decoding method is a Maximum a posteriori Probability (MAP) estimation. If loops exist in the parity check matrix, sum-product decoding method is degraded from MAP estimation and only approximates MAP estimation. As a result, a number of parity check matrix generation methods have been proposed for preventing the occurrence of loops in the parity check matrix.

In addition, the parity check matrix not only determines the error-correcting characteristics, but also determines the calculation costs (number of calculations) in encoding and the calculation costs for generating a generator matrix. Typically, O (n2) calculations are necessary for carrying out encoding, but O (n3) calculations are necessary for calculating a generator matrix.

To reduce the calculation cost for calculation of the generator matrix and the calculation cost in encoding, a method has been proposed in which a portion of a parity check matrix is constructed as a unit matrix or a triangular matrix to limit the number of calculations to O (n) during calculation for a generator matrix or encoding.

For example, Patent Document 2 describes a low-density parity-check encoding method in which the power of square matrices that represent cyclic shifts are used as partial matrices, and these partial matrices are assembled to make up a parity check matrix to prevent the generation of short loops. In the low-density parity-check encoding method described in Patent Document 2, the parity check matrix is triangulated at the same time that the generation of loops is prevented. Then, by making the generator matrix and parity check matrix equivalent, the number of calculations when encoding can be limited to O(n). In addition, in the low-density parity-check encoding method described in Patent Document 2, the cost of generating the parity check matrix is low because the parity check matrix can be generated by merely using regular shifts.

Non-Patent Document 1: Michael G. Luby, Michael Mitzenmacher, M. Amin Shokrollahi, Daniel A. Spielman, Efficient Erasure Correcting Codes, "IEEE Transactions on Information Theory," February 2001, Vol. 47, No. 2, pp. 569-584.

Non-Patent Document 2: Thomas J. Richardson, M. Amin Shokrollahi, Design of Capacity-Approaching Irregular Low-Density Parity-Check Codes, "IEEE Transactions on Information Theory," February 2001, Vol. 47, No. 2, pp. 619-637.

Patent Document 1: JP-A-2003-198383 (pp. 4-10, FIGS. 1-18)

Patent Document 2: JP-A-2003-115768 (pp. 6-10, FIGS. 1-9)

DISCLOSURE OF THE INVENTION

The LDPC code parity check matrix generation method described in Patent Document 1 enables a reduction of the cost of generating a parity check matrix. However, this method cannot reduce the calculation costs for calculating a generator matrix from a parity check matrix or the calculation costs when using the calculated generator matrix to encode. Further, this method necessitates complex calculations that use pseudo-random numbers and a linear programming method for generating a parity check matrix.

In addition, in the low-density parity-check encoding method described in Patent Document 2, the row weighting and column weighting of a matrix before carrying out triangulation are uniform, and the generated parity check matrix approaches the parity check matrix of a regular LDPC code. As a result, a parity check matrix cannot be generated to always produce an improvement in the error-correcting characteristics.

It is therefore an object of the present invention to provide a parity check matrix generation method, a data transmission system, an encoding device, a decoding device, and a parity check matrix generation program that can realize superior error-correcting characteristics in low-density parity-check codes and that can generate a parity check matrix by a simple method.

It is another object of the present invention to provide a parity check matrix generation method, a data transmission system, an encoding device, a decoding device, and a parity check matrix generation program that can limit calculation costs when generating a parity check matrix and when encoding.

The parity check matrix generation method according to the present invention: is a parity-check matrix generation method for generating parity check matrix H of m rows and n columns in low-density parity-check code; wherein parity check matrix H is made up from partial matrix H1 of m rows and k columns (where k=n−m) and partial matrix H2 of m rows and m columns; and wherein the positions of matrix elements "1" of each row of partial matrix H1 are determined to satisfy the conditions that, when any two rows contained in partial matrix H1 are selected, the periods of the two rows are relatively prime, or when the periods of the two rows are identical, the phases are different.

In addition, the parity check matrix generation method may be configured such that period list P={p(1), p(2), ..., p(PL)} (where p(1)-p(PL) are relatively prime) is determined; and, for each of elements p(j) of period list P, a maximum p(j) rows of partial matrix H1 are generated in which the periods are p(j) and the phases are different. According to this configuration, the mere input of period list P enables the easy generation of partial matrix H1.

The parity check matrix generation method may also be configured such that elements from element p(2) to element p(PL) are generated based on the leading element p(1). According to this configuration, the mere input of the leading element of period list P automatically determines period list P and enables the easy generation of partial matrix H1.

The parity check matrix generation method may also be configured to generate elements p(j) of period list P such that elements p(j) are the smallest values among values that satisfy the condition of being relatively prime with all elements from leading element p(1) to element p(j−1). According to this configuration, the mere input of the leading element of period list P automatically determines period list P and enables the easy generation of a parity check matrix.

The parity check matrix generation method may also be configured to generate elements p(j) of period list P such that elements p(j) are the smallest values among values that each satisfy the condition of being a prime number greater than the preceding element p(j−1). According to this configuration, the mere input of the leading element of period list P automatically determines period list P and enables the easy generation of a parity check matrix.

The parity check matrix generation method may also be configured to generate a unit matrix as partial matrix H2. According to this configuration, the cost of generating a generator matrix and the cost of encoding can be reduced compared to a case in which the parity check matrix does not contain a unit matrix.

The parity check matrix generation method may also be configured to generate a lower triangular matrix as partial matrix H2 by determining the positions of matrix elements "1" within a lower triangle such that the conditions are satisfied that, when any two rows contained within partial matrix H2 are selected, the periods of the two rows are relatively prime, or when the periods of the two rows are identical, their phases are different. According to this configuration, the cost of generating a generator matrix and the cost of encoding can be reduced compared to a case in which the parity check matrix does not contain a lower triangular matrix.

The parity check matrix generation method may also be configured such that period list P={p(1), p(2), ..., p(PL)} (where p(1)-p(PL) are relatively prime) is determined, and, for each of elements p(j) of period list P, a maximum of p(j) rows of partial matrix H2 are generated in which the periods are p(j) and the phases are different. According to this configuration, the mere input of period list P enables the easy generation of partial matrix H2.

The parity check matrix generation method may also be configured to generate elements from element p(2) to element p(PL) based on leading element p(1). According to this configuration, the mere input of the leading element of period list P enables the automatic determination of period list P and the easy generation of partial matrix H2.

The parity check matrix generation method may also be configured to generate elements p(j) of period list P such that elements p(j) are the smallest values of values that satisfy the condition of being relatively prime with all elements from leading element p(1) to element p(j−1). According to this configuration, the mere input of the leading element of period list P enables the automatic determination of period list P and the easy generation of partial matrix H2.

The parity check matrix generation method may also be configured to generate elements p(j) of period list P such that elements p(j) are the smallest values of values that each satisfy the condition of being a prime number greater than the preceding element p(j−1). According to this configuration, the mere input of the leading element of the period list P enables the automatic determination of period list P and the easy generation of partial matrix H2.

The parity check matrix generation method may also be a parity check matrix generation method for generating a parity check matrix of m rows and n columns in a low-density parity-check code; and may be configured to generate row r of a parity check matrix by using period list P={p(1), p(2), ..., p(PL)} (where p(1)-p(PL) are relatively prime) to: set as "1" those matrix elements that correspond to columns c that satisfy the conditions, using integer i and prescribed value F(j), $1 \leq c \leq n-m$ and $c = p(j) \cdot i + r + F(j)$ if $N(j−1)+1 \leq r \leq N(j)$, where N(j) is defined as the sum of values from element p(1) to element p(j) of period list P, and moreover, N(0) is defined as "0"; to set as "1" those matrix elements that correspond to columns c that satisfy the condition c=n−m+r; and to set as "0" those matrix elements that do not satisfy any of the conditions.

According to this configuration, instead of generating for each partial matrix, a parity check matrix of m rows and n columns can be generated as a batch to satisfy the conditions that, when any two rows are selected, the two rows have periods that are relatively prime, or when the periods are identical, the two rows have different phases. In addition, instead of generating for each partial matrix, a parity check matrix can be generated as a group to contain a unit matrix.

As a result, superior error-correcting characteristics can be realized in low-density parity-check codes, and a parity check matrix can be generated by a simple method. In addition, the cost of generating a generator matrix and the cost of encoding can be reduced compared to a case in which parity check matrix H does not include a unit matrix.

The parity check matrix generation method may also be configured such that F(j)=−N(j−1).

The parity check matrix generation method may also be configured such that F(j)=n−m.

In addition, the parity check matrix generation method may be a parity check matrix generation method for generating a parity check matrix of m rows and n columns in low-density parity-check codes; and may be configured to generate row r of a parity check matrix by using period list P={p(1), p(2), ..., p(PL)} (where p(1)-p(PL) are relatively prime) to: set as "1" those matrix elements that correspond to columns c that satisfy the conditions, using integer i, $1 \leq c \leq n-m+r$ and $c=p(j) \cdot i+n-m+r$ if $N(j−1)+1 \leq r \leq N(j)$, where N(j) is defined as the sum of values from element p(1) to element p(j) of period list P, and moreover, N(j) is defined as "0"; and to set as "0" matrix elements that do not satisfy these conditions.

According to this configuration, without generating for each partial matrix, a parity check matrix of m rows and n columns can be generated as a group to satisfy the conditions that, when any two rows are selected, the two rows have periods that are relatively prime, or when the periods are identical, the two rows have different phases. In addition, a parity check matrix can be generated as a group to contain a lower triangular matrix without generating for each partial matrix. Accordingly, superior error-correcting characteristics can be realized in low-density parity-check codes, and a parity check matrix can be generated by a simple method. Further, the cost of generating a generator matrix and the cost of encoding can be reduced compared to a case in which a parity check matrix does not contain a lower triangular matrix.

The parity check matrix generation method may also be a parity check matrix generation method for generating a parity check matrix of m row and n columns in low-density parity-check codes; and may be configured to generate row r of a parity check matrix by using period list P={p(1), p(2), ..., p(PL)} (where p(1)-p(PL) are relatively prime) and period list Q={q(1), q(2), ..., q(QL)} (where q(1)-q(QL) are relatively prime) to: set as "1" those matrix elements that correspond to columns c that satisfy the conditions, using integer i and a prescribed value F(j), $1 \leq c \leq n-m$ and $c=p(j) \cdot i+r+F(j)$ if $N(j−1)+1 \leq r \leq N(j)$, where N(j) is defined as the sum of values from element p(1) to element p(j) of period list P, and moreover, N(j) is defined as "0"; to set as "1" those matrix elements that correspond to columns c that satisfy the conditions, using integer i, $n-m+1 \leq c \leq n-m+r$ and $c=q(j) \cdot i+n-m+r$ if $M(j−1)+1 \leq r \leq M(j)$, where M(j) is defined as the sum of values from element q(1) to element q(j) of period list Q, and moreover, M(j) is defined as "0"; and to set as "0" those matrix elements that do not satisfy any of these conditions. According to this configuration, a parity check matrix of m rows and n columns can be generated as a group based on two types of period lists such that the conditions are satisfied that, when any two rows are selected, the two rows have periods that are relatively prime, or when the periods are identical, the two rows have different phases. In addition, the parity check matrix can be generated as a group to contain a lower triangular matrix.

The parity check matrix generation method can also be configured such that F(j)=−N(j−1).

The parity check matrix generation method can also be configured such that F(j)=n−m.

The parity check matrix generation method can also be configured to determine period list P by generating elements from element p(2) to element p(PL) based on leading element p(1). According to this configuration, the mere input of the leading element of period list P enables the automatic determination of period list P and the easy generation of a parity check matrix.

The parity check matrix generation method may also be configured to generate elements p(j) of period list P such that elements p(j) are the smallest values of values that satisfy the condition of being relatively prime with all elements from leading element p(1) to element p(j−1). According to this configuration, the mere input of the leading element of period list P enables the automatic determination of period list P and the easy generation of a parity check matrix.

The parity check matrix generation method may also be configured to generate elements p(j) of period list P such that elements p(j) are the smallest values of values that each satisfy the condition of being a prime number greater than the preceding element p(j−1). According to this configuration, the mere input of the leading element of period list P enables the automatic determination of period list P and the easy generation of a parity check matrix.

The data transmission system according to the present invention is a data transmission system that includes: an encoding device for encoding data and a decoding device for decoding data that have been encoded; wherein the encoding device, based on prescribed parameters, uses a parity check matrix generation method to generate a parity check matrix, uses the generated parity check matrix to perform low-density parity encoding to convert data to codewords, and transmits the converted codewords to the decoding device by way of a transmission line; and the decoding device, based on parameters identical to the parameters used by the encoding device, uses the parity check matrix generation method to generate a parity check matrix, and uses the generated parity check matrix to decode the codewords that have been received from the encoding device to convert to the data that preceded encoding.

The encoding device may be configured to generate the parity check matrix based on a prescribed period list P as the parameters, and the decoding device can be configured to generate a parity check matrix based on period list P identical to period list P used by the encoding device. According to this configuration, simply determining period list P enables the easy generation of a parity check matrix.

Further, the encoding device may also be configured to determine period list P by generating elements from element $p(2)$ to element $p(PL)$ based on the leading element $p(1)$ of period list P as the parameters and to generate a parity check matrix based on the determined period list, and the decoding device may be configured to determine period list P by generating elements from element $p(2)$ to element $p(PL)$ based on element $p(1)$ that is identical to element $p(1)$ used by the encoding device, and to generate a parity check matrix based on the determined period list. According to this configuration, merely determining the leading element of period list P enables the automatic determination of period list P and the easy generation of a parity check matrix.

The encoding device may also be configured to generate elements $p(j)$ of period list P such that elements $p(j)$ are the smallest values of values that satisfy the condition of being relatively prime with all elements from leading element $p(1)$ to element $p(j-1)$; and the decoding device may be configured to generate elements $p(j)$ of period list P such that elements $p(j)$ are the smallest values of values that satisfy the condition of being relatively prime with all elements from leading element $p(1)$ to element $p(j-1)$. According to this configuration, merely determining the leading element of period list P enables the automatic determination of period list P and the easy generation of a parity check matrix.

In addition, the encoding device may also be configured to generate elements $p(j)$ of period list P such that elements $p(j)$ are the smallest values of the values that each satisfy the condition of being a prime number greater than the preceding element $p(j-1)$; and the decoding device may be configured to generate elements $p(j)$ of period list P such that elements $p(j)$ are the smallest values of values that each satisfy the condition of being a prime number greater than the preceding element $p(j-1)$. According to this configuration, merely determining the leading element of period list P enables the automatic determination of period list P and the easy generation of a parity check matrix.

The encoding device may also be configured to transmit parameters to the decoding device by way of a transmission line, and the decoding device may be configured to use the parameters received from the encoding device to generate a parity check matrix based on parameters identical to the parameters used by the encoding device. According to this configuration, the unity of the period list used by the encoding device and the period list used by the decoding device can be easily maintained.

The decoding device may also be configured to transmit parameters to the encoding device by way of a transmission line, and the encoding device may be configured to use the parameters received from the decoding device to generate a parity check matrix based on parameters identical to parameters used by the decoding device. According to this configuration, the unity of the period list used by the encoding device and the period list used by the decoding device can be easily maintained.

The encoding device may also be configured to transmit parameters for each of prescribed time intervals to the decoding device by way of a transmission line, and the decoding device may be configured to use the parameters received from the encoding device to thus generate a parity check matrix based on parameters identical to parameters used by the encoding device. According to this configuration, the unity of the period list used by the encoding device and the period list used by the decoding device can be easily maintained.

The decoding device may also be configured to transmit parameters for each of prescribed time intervals to the encoding device by way of a transmission line, and the encoding device may be configured to use the parameters received from the decoding device to generate a parity check matrix based on parameters identical to parameters used by the decoding device. According to this configuration, the unity of the period list used by the encoding device and the period list used by the decoding device can be easily maintained.

The encoding device may also be configured to transmit parameters to the decoding device by way of a transmission line when the content of parameters has been updated, and the decoding device may be configured to use parameters received from the encoding device to generate a parity check matrix based on parameters identical to parameters used by the encoding device. According to this configuration, the unity of the period list used by the encoding device and the period list used by the decoding device can be maintained in real time.

The decoding device may also be configured to transmit parameters to the encoding device by way of a transmission line when the content of parameters has been updated, and the encoding device may be configured to use parameters received from the decoding device to generate a parity check matrix based on parameters identical to parameters used by the decoding device. According to this configuration, the unity of the period list used by the encoding device and the period list used by the decoding device can be maintained in real time.

The encoding device according to the present invention, based on prescribed parameters, uses a parity check matrix generation method to generate a parity check matrix, uses the generated parity check matrix to perform low-density parity encoding to convert data to codewords, and transmits the converted codewords to a decoding device by way of a transmission line.

The decoding device according to the present invention receives codewords from the encoding device by way of a transmission line, and, based on prescribed parameters, uses a parity check matrix generation method to generate a parity check matrix, uses the generated parity check matrix to decode the received codewords and convert to the data that preceded encoding.

The parity check matrix generation program of the present invention is a parity check matrix generation program for generating parity check matrix H of m rows and n columns in low-density parity-check code; and causes a computer to execute processes of: constructing parity check matrix H from partial matrix H1 of m rows and k columns and partial matrix H2 of m rows and m columns (where m=n−k); and determining the positions of matrix elements "1" of each row of partial matrix H1 to satisfy the conditions that, when any two rows contained in partial matrix H1 are selected, the periods of the two rows are relatively prime, or the periods of the two rows are identical and the phases are different.

The parity check matrix generation program may also be a parity check matrix generation program for generating a parity check matrix of m rows and n columns in low-density parity-check code, and may be configured to cause a computer to execute processes of: generating row r of a parity check matrix by using period list P={p(1), p(2), ..., p(PL)} (where p(1)-p(PL) are relatively prime) to: set as "1" those matrix elements that correspond to columns c that satisfy the conditions, using integer i and a prescribed value F(j), $1 \leq c \leq n-m$ and $c = p(j) \cdot i + r + F(j)$ if $N(j-1)+1 \leq r \leq N(j)$, where N(j) is defined to be the sum of values from element p(1) to element p(j) of period list P, and moreover, N(j) is defined to be "0"; and to set as "0" those matrix elements that do not satisfy any of these conditions. According to this configuration, a parity check matrix of m rows and n columns can be generated as a group without generating for each partial matrix, such that the conditions are satisfied that, when any two rows are selected, the two rows have periods that are relatively prime, or when the periods are identical, the rows have different phases. In addition, a parity check matrix can be generated as a group to contain a unit matrix without generating each partial matrix. Accordingly, superior error-correcting characteristics can be realized in low-density parity-check code, and a parity check matrix can be generated by a simple method. Further, the cost of generating a generator matrix and the cost of encoding can be reduced compared to a case in which parity check matrix H does not include a unit matrix.

The parity check matrix generation program may also be a parity check matrix generation program for generating a parity check matrix of m rows and n columns in low-density parity-check code, and may be configured to cause a computer to execute processes of: generating row r of a parity check matrix by using period list P={p(1), p(2), ..., p(PL)} (where p(1)-p(PL) are relatively prime) to set as "1" matrix elements that correspond to columns c that satisfy the conditions, using integer i, $1 \leq c \leq n-m+r$ and $c = p(j) \cdot i + n-m+r$ if $N(j-1)+1 \leq r \leq N(j)$, where N(j) is defined to be the sum of values from element p(1) to element p(j) of period list P, and moreover, where N(j) is defined to be "0," and to set as "0" matrix elements that do not satisfy any of these conditions.

According to this configuration, a parity check matrix of m rows and n columns can be generated as a group without generating each partial matrix, such that the conditions are satisfied that, when any two rows are selected, the two rows have periods that are relatively prime, or when the periods are identical, the rows have different phases. In addition, a parity check matrix can be generated as a group to contain a lower triangular matrix without generating each partial matrix. Accordingly, superior error-correcting characteristics can be realized in a low-density parity-check code, and a parity check matrix can be generated by a simple method. Further, the cost of generating a generator matrix and the cost of encoding can be reduced compared to a case in which the parity check matrix does not include a lower triangular matrix.

The parity check matrix generation program may also be a parity check matrix generation program for generating a parity check matrix of m rows and n columns in low-density parity-check code, and may be configured to cause a computer to execute a process of generating row r of a parity check matrix by using period list P={p(1), p(2), ..., p(PL)} (where p(1)-p(PL) are relatively prime) and period list Q={q(1), q(2), ..., q(QL)} (where q(1)-q(QL) are relatively prime) to: set as "1" those matrix elements that correspond to columns c that satisfy the conditions, using integer i and a prescribed value F(j), $1 \leq c \leq n-m$ and $c = p(j) \cdot i + r + F(j)$ if $N(j-1)+1 \leq r \leq N(j)$, where N(j) is defined as the sum of values from element p(1) to element p(j) of period list P, and moreover, N(j) is defined as "0"; to set as "1" those matrix elements that correspond to columns c that satisfy the conditions, using integer i, $n-m+1 \leq c \leq n-m+r$ and $c = q(j) \cdot i + n - m + r$ if $M(j-1)+1 \leq r \leq M(j)$, where M(j) is defined as the sum of values from element q(1) to element q(j) of period list Q, and moreover, M(j) is defined as "0"; and to set as "0" those matrix elements that do not satisfy any of these conditions. According to this configuration, a parity check matrix of m rows and n columns can be generated as a group based on two types of period lists such that the conditions are satisfied that, when any two rows are selected, the two rows have periods that are relatively prime, or when the periods are identical, the two rows have different phases. In addition, a parity check matrix can be generated as a group to contain a lower triangular matrix.

According to the present invention, partial matrix H1 of parity check matrix H is generated to satisfy the condition that, when any two rows are selected, the two rows have periods that are relatively prime, or when the periods are identical, the two rows have different phases. When the two rows have periods that are relatively prime, the existence of common columns in the two rows can be prevented. In addition, when the two rows have identical periods but have different phases, the existence of common columns in the two rows can be limited to a maximum of just one common column. As a result, the degradation of the error-correcting capabilities caused by short loops in a bipartite graph can be prevented. In addition, because rows are generated using a plurality of periods that are relatively prime, degradation of error-correcting capabilities caused by uniformity of row weighting can be prevented. Finally, the generation of partial matrix H1 can be simplified if the periods and phases are determined. Accordingly, superior error-correcting characteristics can be realized in low-density parity code and a parity check matrix can be generated by a simple method.

BRIEF DESCRIPTION OF THE DRAWINGS

FIG. 1 is a block diagram showing an example of the configuration of a data transmission system;

FIG. 2 is an explanatory view showing an example of a parity check matrix of regular LDPC code;

FIG. 3A shows an example of parity check matrix;

FIG. 8 is an explanatory view showing another example of parity check matrix H generated by processor 50;

Figure 3B:
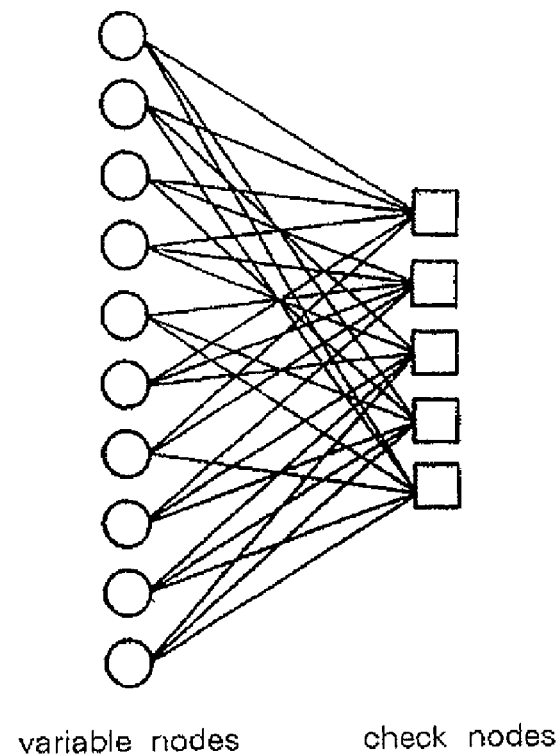
FIG. 3B is an explanatory view showing an example of a bipartite graph for the parity check matrix.

EXPLANATION OF REFERENCE NUMERALS 50 processor
51 memory
52 input/output unit

BEST MODE FOR CARRYING OUT THE INVENTION

First Embodiment

Figure 4:
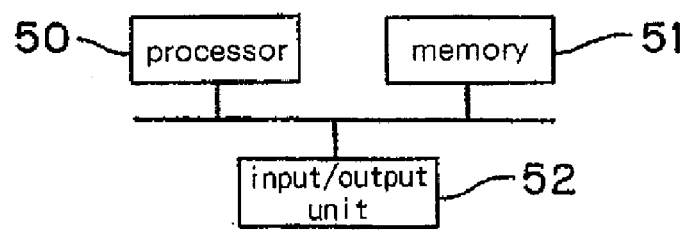
FIG. 4 is a block diagram showing an example of the configuration of a transmission line encoder in which the parity check matrix generation method according to the present invention is applied.

Explanation next regards the first embodiment of the present invention with reference to the accompanying figures. FIG. 4 is a block diagram showing an example of the configuration of a transmission line encoder that applies the parity check matrix generation method according to the present invention. As shown in FIG. 4, the transmission line encoder includes processor 50, memory 51, and input/output unit 52.

In FIG. 4, processor 50 generates a parity check matrix of LDPC code and writes the generated parity check matrix to memory 51. Processor 50 further reads a data string (a message) from memory 51 and subjects the data string that has been read to LDPC encoding to generate codewords. Processor 50 then supplies the generated codewords to input/output unit 52. Memory 51 stores, for example, a parity check matrix and data strings. Input/output unit 52 supplies codewords from processor 50 to the outside. For example, input/output unit 52 transmits codewords by way of a transmission line to a transmission line decoder. When a data string is received as input from the outside, input/output unit 52 writes the received data string to memory 51.

Transmission line encoder is equipped with a memory unit (not shown) for storing various programs for causing processor 50 to execute processes for generating a parity check matrix and for encoding data strings. For example, the memory unit of transmission line encoder stores a parity check matrix generation program for causing a computer to execute a process for forming parity check matrix H from partial matrix H1 of m rows and k columns and partial matrix H2 of m rows and m columns (where m=n−k), and a process for determining the positions of matrix elements "1" of each row of partial matrix H1 to satisfy the conditions that, when any two rows contained in partial matrix H1 are selected, the periods of the two rows are relatively prime, or when the periods of the two rows are identical, their phases are different.

In the present embodiment, explanation regards a case in which processor 50 generates parity check matrix H of m rows and n columns used in the encoding of LDPC codes, where the message length is k and the codeword length is n. In this case, m=n−k. In this embodiment, processor 50 constructs parity check matrix H from partial matrix H1 of m rows and k columns on the left side and partial matrix H2 of m rows and m columns on the right side.

In the present embodiment, processor 50 generates partial matrix H2 as a unit matrix. In addition, processor 50 generates partial matrix H1 as a matrix having matrix elements "1" or "0" in accordance with prescribed conditions. Processor 50 then joins partial matrix H1 and partial matrix H2 to generate parity check matrix H. The following explanation regards the process of generating partial matrix H1.

Processor 50 generates partial matrix H1 such that, in each row, matrix elements of positions that are determined by prescribed periods and prescribed phases are "1" and such that other matrix elements are "0." "Period" here indicates the distance between an element "1" and another element "1" that are contained within a row. In the present embodiment, elements "1" are arranged for each period within a row. In addition, "phase" is the position of the column of the element farthest to the left among elements "1" that are within a row. Phase assumes a value from 1 to the period. If the period and phase are determined, the positions of elements "1" and the number of elements "1" within a row are determined.

In the present embodiment, processor 50 generates partial matrix H1 to satisfy the conditions that, when any two rows contained in partial matrix H1 are selected, the two rows have periods that are relatively prime, or when the periods are identical, the two rows have different phases. When successively generating each row of partial matrix H1, processor 50 selects the period and phase used in generating the next row to satisfy either of the two conditions with respect to the periods and phases of all rows that have been generated to that point.

Figure 5:
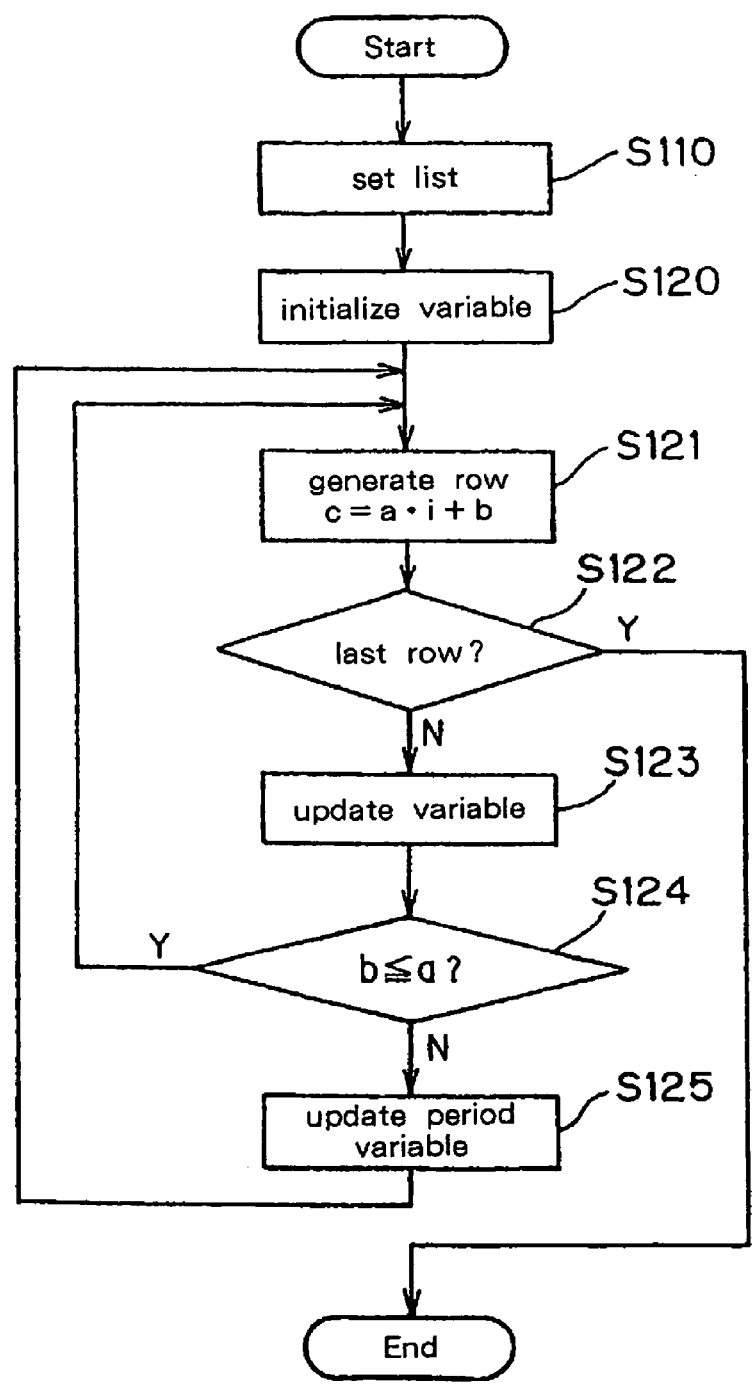
FIG. 5 is a flow chart showing an example of the progression of processes by which processor 50 generates partial matrix H1.

FIG. 5 is a flow chart showing an example of the progression of processes by which processor 50 generates partial matrix H1. Processor 50 sets period list P={p1, p2, . . . , pj} (Step S110). For example, when each element of period list P is applied as input by the user, processor 50 sets period list P that contains each element that has been applied as input. Alternatively, for example, when each element is received as input in accordance with the host application, processor 50 sets period list P that contains each element that has been received as input. In Step S10, settings are made such that each of the elements of period list P are relatively prime, and such that the sum of the values of the elements of period list P is equal to or greater than m.

Processor 50 initializes each variable used in the generation of each row of partial matrix H1 (Step S120). In the present embodiment, period variable a that indicates period, variable b, and generation-target row number r, which indicates the row that is the object of generation among each of the rows of partial matrix H1, are used as variables. In the present embodiment, moreover, the value of variable b coincides with the position of the element farthest to the left among elements "1" of each row.

Thus, in the present embodiment, variable b plays the role of a phase variable that indicates phase.

In Step S120, processor 50 sets the leading element p1 of period list P as the initial value of period variable a and sets the initial value of variable b to "1." Processor 50 further sets the initial value of generation-target row number r to "1."

Processor 50 generates the row that corresponds to generation-target row number r (Step S121). In Step S121, processor 50 uses the generation equation $c = a \cdot i + b$ to generate row r of partial matrix H1. Processor 50 generates row r by setting the matrix elements located in columns c that are indicated by generation equation $c = a \cdot i + b$ to "1" and setting the other matrix elements to "0." In this case, "i" is an integer.

Processor 50 next determines whether the generated row r is the last row of partial matrix H1 (Step S122). If the generated row r is determined to be the last row, processor ends the process of generating partial matrix H1. If the generated row r is determined not to be the last row, processor 50 updates variable b and generation-target row number r (Step S123). In Step S123, processor 50 adds "1" to generation-target row number r. Processor 50 further adds "1" to variable b.

Upon updating variable b, processor 50 determines whether variable b is equal to or less than period variable a (Step S124). If "b" is determined to be equal to or less than "a," processor 50 returns to the process of Step S121 and repeatedly executes the processes from Step S121.

Upon determining that b is not less than or equal to a, processor 50 updates period variable a (Step S125). In Step S125, processor 50 reads the value of the next element from period list P to set this value to period variable a. Processor 50 further sets the value of variable b to 1. Processor 50 then returns to the process of Step S121 and repeatedly executes the processes from Step S121.

Figure 6:
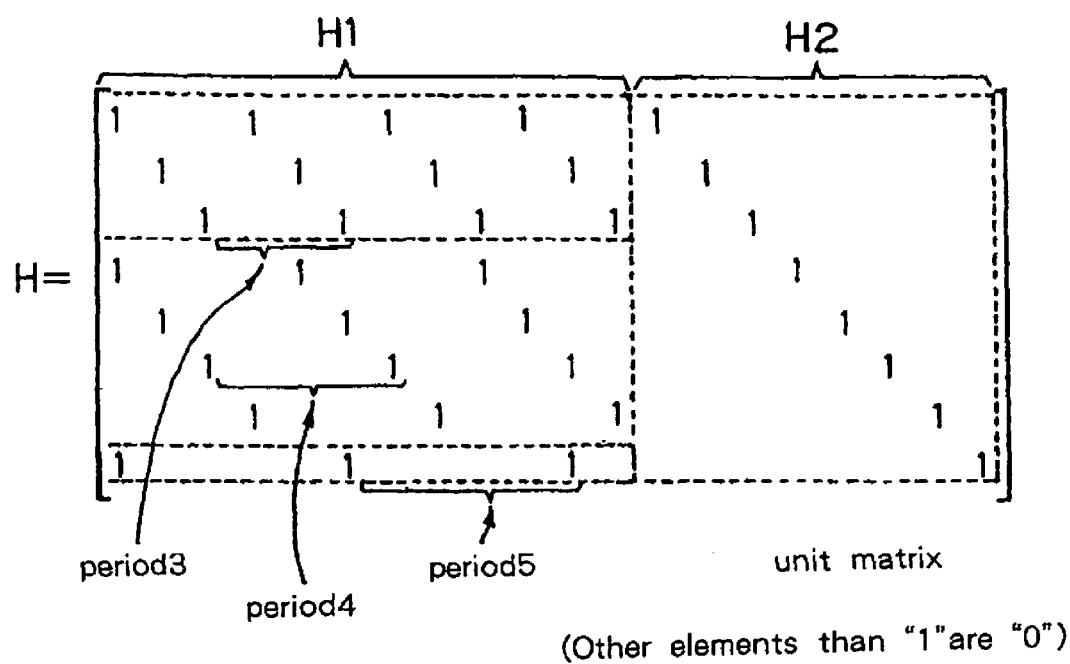
FIG. 6 is an explanatory view showing an example of parity check matrix H that is generated by processor 50.

FIG. 6 is an explanatory view showing an example of parity check matrix H generated by processor 50. Parity check matrix H shown in FIG. 6 is a matrix that has been generated with message length set to k=12 and codeword length set to n=20. Accordingly, as shown in FIG. 6, the number of rows of parity check matrix H is m=n−k=8. In addition, as shown in FIG. 6, processor 50 generates partial matrix H2 in parity check matrix H as a unit matrix. Partial matrix H1 within parity check matrix H is set to period list P={3, 4, 5} in Step S110 and generated according to the process shown in FIG. 2.

For example, in Step S120, processor 50 sets leading element 3 of period list P as the initial value of period variable a and sets the initial values of variable b and generation-target row number r to "1." In Step S121, processor 50 uses these variables a and b to find each of c=1, 4, 7, and 10 for i=0, 1, 2, and 3, respectively. Then, as shown in FIG. 6, processor 50 sets the elements of the first, fourth, seventh, and tenth columns among the elements of the first row of partial matrix H1 to "1" and the other elements to "0" to generate the row.

In Step S123, when variable b and generation process object row number r are each updated to "2", processor 50 uses period variable a=3 and variable b=2 to find each of c=2, 5, 8, and 11 for i=0, 1, 2, and 3, respectively. Processor 50 then sets the elements of the second, fifth, eighth, and eleventh columns among the elements of the second row of partial matrix H1 to "1" and sets the other elements to "0" to generate the row, as shown in FIG. 6.

When the third row of partial matrix H1 is generated and variable b is updated to "4," processor 50 determines whether variable b=4 is not less than or equal to variable a=3, and then updates period variable a to "4" in Step S124. Processor 50 then uses period variable a=4 to generate the fourth to seventh rows of partial matrix H1 as shown in FIG. 6.

Upon generating the eighth row of partial matrix H1, processor 50 determines that the generated row r=8 is the last row and terminates the process. Partial matrix H1 is thus generated by the above-described procedure. Processor 50 then joins partial matrix H1 and partial matrix H2 to generate parity check matrix H shown in FIG. 6.

As shown in FIG. 6, in partial matrix H1 in the present example, rows exist that correspond to all phases (phases from 1 to the value of the period) for period 3 and period 4, but only a row corresponding to phase 1 exists for period 5.

As shown in FIG. 6, the periods of any row of the first to third rows of partial matrix H1, any row of the fourth to seventh rows, and the eighth row are all relatively prime, and no more than one common column exists. In addition, when any two rows of the first to third rows are selected, the periods for both are identical at "3," but the phases for the two differ and no common column exists. Similarly, when any two rows of the fourth to seventh rows are selected, the periods are identical at "4," but the phases differ and no common column exists.

In Step S121, c=a·i+k+r may be used as the generation equation instead of using the condition c=a·i+b as the generation equation. By adopting this form, the phases of partial matrices H1 and H2 can be combined when the entirety of parity check matrix H is seen.

In addition, although period list P contains a plurality of elements, this plurality of elements can also be generated from a single parameter. For example, the elements of period list P satisfy not only the condition of being relatively prime, but also satisfy the condition of being in a rising progression. When the elements of period list P are defined to be the smallest value of the values that satisfy two conditions, merely determining the leading element p1 as a parameter enables the determination of each element of the entirety of period list P.

Alternatively, if elements p1 other than the leading element p1 are each defined to be the smallest prime number of prime numbers that are greater than the preceding element p(i−1), merely determining the leading element p1 enables the determination of the entirety of period list P.

Although a case was described in the present embodiment in which all of period list P was set in Step S110, each element may be definitively derived by adopting a definition for generating each element of period list P from a single parameter. In such a case, processor 50 may generate elements of period list P with each update of period variable a in Step S125. For example, processor 50 may set only element p1 in Step S110 and then find the next value that satisfies the defined condition in Step S125. By adopting this approach, an operation can be realized that is essentially equivalent to setting the entirety of period list P in Step S10.

In the present embodiment, moreover, a case was described in which the transmission line encoder generated parity check matrix H for use in LDPC encoding, but the parity check matrix generation method can also be applied to a case in which a transmission line decoder generates parity check matrix H for use in decoding codewords.

As described above, according to the present embodiment, parity check matrix H of m rows and n columns used in low-density parity-check codes is made up from partial matrix H1 of m rows and k columns on the left side and partial matrix H2 of m rows and m columns on the right side. In addition, processor 50 generates partial matrix H1 to satisfy the conditions that, when any two rows contained in partial matrix H1 are selected, the two rows have periods that are relatively prime (condition a) or when the periods are identical, have phases that differ (condition b).

According to the present embodiment, processor 50 generates partial matrix H2 as a unit matrix.

Common columns never occur in any two rows of the rows of parity check matrix H that contains the rows of partial matrix H1 that have been generated according to condition b. As a result, the occurrence of short loops having a length of 4 can be prevented, and the degradation of error-correcting capabilities caused by short loops in a bipartite graph can be prevented.

Further, common columns occur for each least common multiple of the period in any two rows of parity check matrix H that contains the rows of partial matrix H1 that have been generated according to condition a. In this case, the periods of the two rows are relatively prime, and the least common multiple is therefore the product of the periods. If periods are selected such that the product of the periods is equal to or greater than k, the number of common columns that occur in the two rows can be limited to just one. As a result, the occurrence of short loops having a length of 4 can be prevented, and degradation of error-correcting capabilities caused by short loops on a bipartite graph can be prevented.

Further, the use of a plurality of periods that are relatively prime to generate rows enables non-uniform row weighting, whereby the degradation of error-correcting capabilities caused by uniformity of row weighting can be prevented.

Still further, if period and phase are determined, partial matrix H1 can be easily generated by using a simple generation equation. Accordingly, superior error-correcting characteristics can be realized in low-density parity-check codes, and parity check matrix H can be generated by a simple method. In addition, because partial matrix H1 can be generated by a simple method, the cost of generating a parity check matrix can be reduced.

According to the present embodiment, partial matrix H2 is generated as a unit matrix, and an input message becomes a portion of codewords. As a result, when processor 50 carries out LDPC encoding, only redundancy portions that are added to the input message need be calculated, and the cost of generating a generator matrix and the cost of encoding can be reduced compared to a case in which parity check matrix H does not include a unit matrix.

Second Embodiment

Explanation next regards the second embodiment of the present invention with reference to the accompanying figures. In this embodiment, the configuration of the transmission line encoder is the same as the transmission line encoder shown in the first embodiment. In the present embodiment, processor 50 of the transmission line encoder generates partial matrix H1 according to the same process as in the first embodiment. In the present embodiment, moreover, processor 50 generates partial matrix H2 as a lower triangular matrix.

Figure 7:
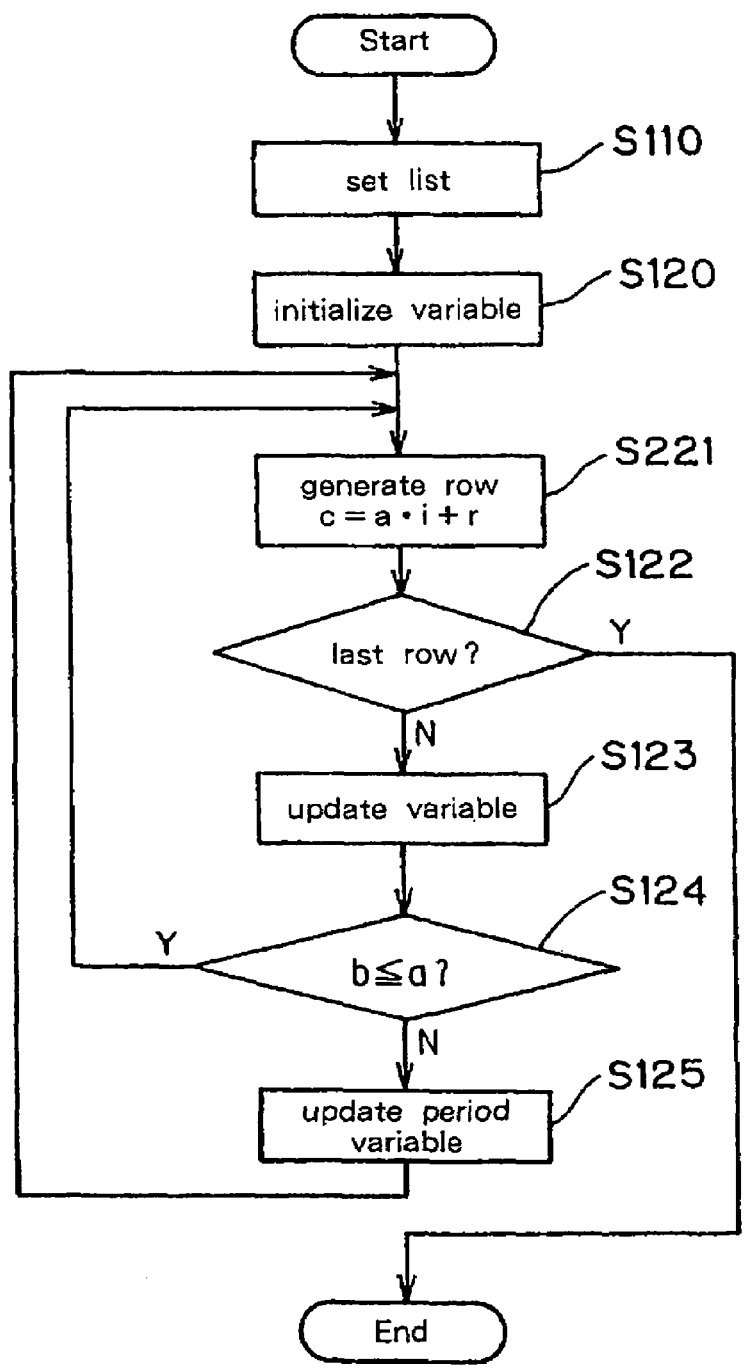
FIG. 7 is a flow chart showing an example of the progression of processes by which processor 50 generates partial matrix H2.

FIG. 7 is a flow chart showing an example of the progression of processes by which processor 50 generates partial matrix H2. In the present embodiment, processor 50 uses a different generation equation to generate each row in Step S221 shown in FIG. 7 than in Step S121 of the first embodiment. The processes other than that of Step S221 are the same as the processes shown in the first embodiment.

In Step S221, processor 50 uses generation equation $c = a \cdot i + r$ to generate row r of partial matrix H2. Processor 50 generates row r by setting to "1" those matrix elements located in columns c that are represented by generation equation $c = a \cdot i + r$ and setting the other matrix elements to "0." In this case, "i" is "0" or a negative integer. Period list P may be identical when generating partial matrix H1 and when generating partial matrix H2, or may differ.

Figure 8:
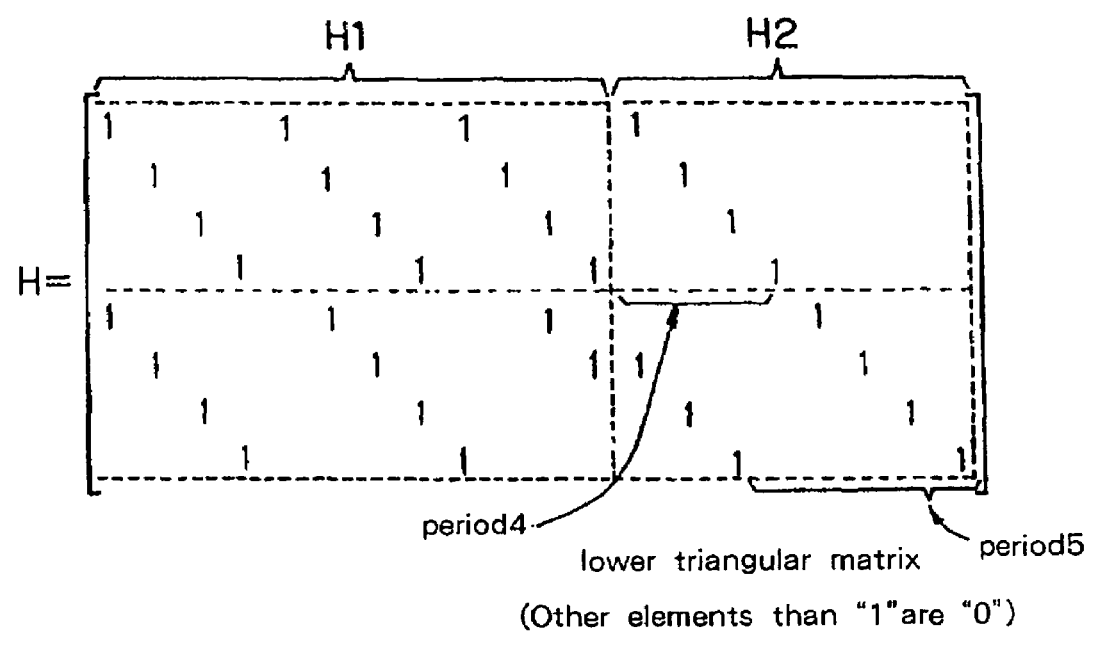

FIG. 8 is an explanatory view showing another example of parity check matrix H that is generated by processor 50. As with parity check matrix H shown in FIG. 6, parity check matrix H shown in FIG. 8 is generated with message length set to k=12, codeword length set to n=20, and the number of rows of parity check matrix H set to m=8. In addition, partial matrices H1 and H2 shown in FIG. 8 are both generated with period list P={4, 5}. As shown in FIG. 8, processor 50 generates partial matrix H2 as a lower triangular matrix according to the procedure shown in FIG. 7.

As shown in FIG. 8, partial matrix H2 can be easily generated as a lower triangular matrix by generating each row to satisfy the conditions that, when any two rows contained in partial matrix H2 are selected, the two rows have periods that are relatively prime, or when the periods are identical, the two rows have phases that are different, as in the generation of partial matrix H1.

Although a case was described in the present embodiment in which partial matrix H2 is a lower triangular matrix, the same error-correcting capabilities are realized when any of the rows and columns of parity check matrix H are substituted. For example, the elements contained in parity check matrix H may be inverted vertically such that partial matrix H2 becomes an upper triangular matrix, and the meaning of LDPC encoding is unchanged. Alternatively, the elements contained in parity check matrix H may be inverted horizontally such that the portion of m rows and m columns on the left side of parity check matrix H becomes a triangular matrix, and the meaning of LDPC encoding is unchanged.

Alternatively, the plurality of elements of period list P may be generated from a single parameter. For example, the elements of period list P may also be defined as the smallest values that satisfy not only the condition of being relatively prime, but also the condition of being in a rising progression. By adopting this approach, simply determining leading element p1 as a parameter enables the determination of each element of the entirety of period list P. Alternatively, if elements p1 other than leading element p1 are each defined to be the smallest prime number of the prime numbers greater than the preceding element p(i−1), merely determining leading element p1 enables the determination of the entirety of period list P.

When generating partial matrix H2, period list P is set to P={p} to contain only one element, and when element p is set to a value equal to or greater than m, processor 50 generates partial matrix H2 as a unit matrix. Accordingly, when settings are made such that period list P={p}, and moreover, such that p is equal to or greater than m, parity check matrix H similar to the first embodiment can be generated.

Although a case has been described in the present embodiment in which the transmission line encoder generates parity check matrix H for use in LDPC encoding, the parity check matrix generation method can also be applied to a case in which a transmission line decoder generates parity check matrix H for use in decoding codewords.

According to the present embodiment as described hereinabove, partial matrix H2 is generated as a lower triangular matrix or a unit matrix by processor 50. When partial matrix H2 is generated as a lower triangular matrix, common columns never occur in any two rows of parity check matrix H that has been generated according to condition b. As a result, the occurrence of short loops having a length of 4 can be prevented, and the degradation of error-correcting capabilities caused by short loops in a bipartite graph can be prevented.

When partial matrix H2 is generated as a lower triangular matrix, common columns occur for each least common multiple of the periods in any two rows of parity check matrix H that has been generated according to condition a. In this case, the periods of the two rows are relatively prime, and the least common multiple is therefore the product of the periods. If periods are selected such that the product of the periods is equal to or greater than n, the number of common columns that occur in two rows of partial matrix H1 can be limited to just one, and the number of common columns that occur in two rows of partial matrix H2 can also be limited to just one. As a result, the occurrence of short loops having a length of 4 can be prevented, and the degradation of the error-correcting capabilities that is caused by short loops in a bipartite graph can be prevented.

When partial matrix H2 is generated as a unit matrix, common columns never occur in any two rows of parity check matrix H that has been generated according to condition b. As a result, the occurrence of short loops having a length of 4 can be prevented, and the degradation of error-correcting capabilities caused by short loops in a bipartite graph can be prevented.

When partial matrix H2 is generated as a unit matrix, common columns occur with each least common multiple of periods in any two rows of parity check matrix H that has been generated according to condition a. In this case, the periods of the two rows are relatively prime, and the least common multiple is therefore the product of the periods. If periods are selected such that the product of the periods is equal to or greater than k, the occurrence of common columns in two rows of parity check matrix H can be limited to just one. As a result, the occurrence of short loops having a length of 4 can be prevented, and the degradation of error-correcting capabilities caused by the short loops in a bipartite graph can be prevented.

According to the present embodiment, partial matrix H2 is generated as a lower triangular matrix or as a unit matrix, and input messages are therefore portions of codewords without alteration. Thus, when carrying out LDPC encoding, processor 50 need calculate only the redundancy portions that are added to input messages, whereby a reduction in the cost of generating a generator matrix and the cost of encoding can be realized compared to a case in which parity check matrix H does not contain a unit matrix or a lower triangular matrix.

Third Embodiment

Explanation next regards the third embodiment of the present invention with reference to the accompanying figures. In the present embodiment, the configuration of the transmission line encoder is the same as the transmission line encoder shown in the first embodiment and in the second embodiment. In the present embodiment, processor 50 of the transmission line encoder does not generate partial matrix H1 and partial matrix H2 separately, but rather, generates partial matrix H1 and partial matrix H2 simultaneously.

Figure 9:
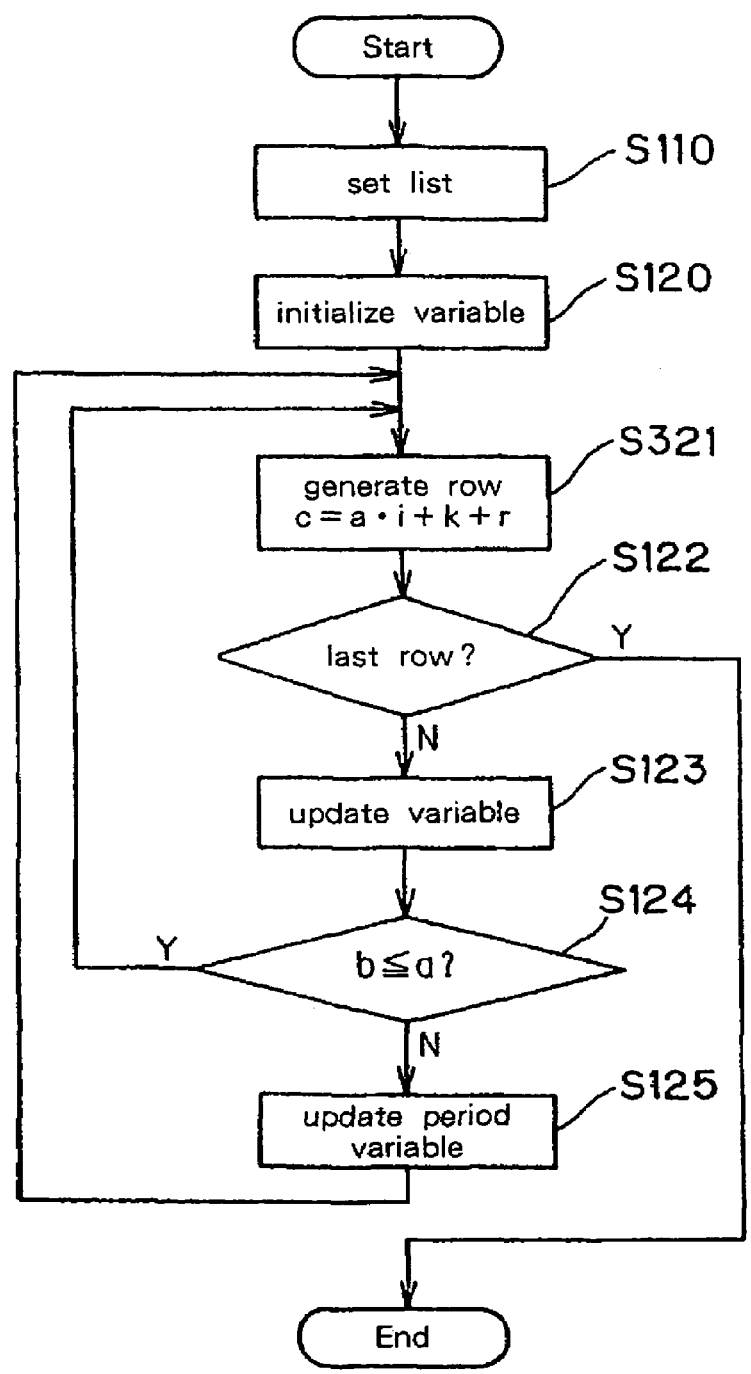
FIG. 9 is a flow chart showing an example of the progression of processes by which processor 50 generates parity check matrix H.

FIG. 9 is a flow chart showing an example of the progression of processes by which processor 50 generates parity check matrix H. In the present embodiment, processor 50 uses a generation equation that differs from the equations used in the first embodiment and the second embodiment to generate each row in Step S321 shown in FIG. 9. In addition, the processes other than Step S321 are the same as the processes of the first embodiment and the second embodiment.

In Step S321, processor 50 uses generation equation $c=a \cdot i+k+r$ to generate parity check matrix H. Processor 50 generates row r by setting matrix elements located in columns c represented by generation equation $c=a \cdot i+k+r$ to "1" and setting the other matrix elements to "0." In this case, "i" is 0 or a negative integer.

Figure 10:
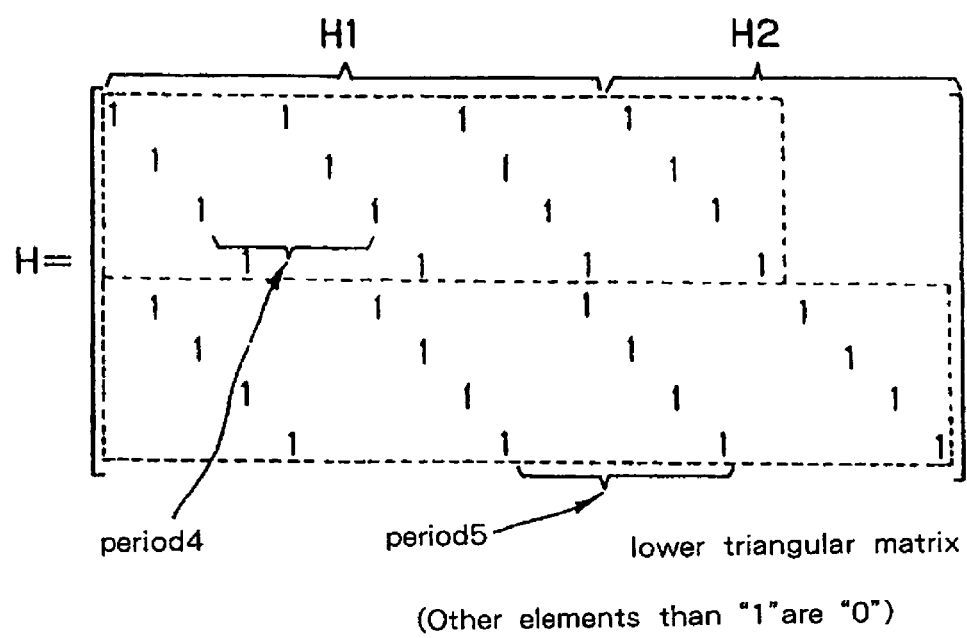
FIG. 10 is an explanatory view showing yet another example of parity check matrix H generated by processor 50.

FIG. 10 is an explanatory view showing yet another example of parity check matrix H that is generated by processor 50. Parity check matrix H shown in FIG. 10 is a matrix generated with the message length set to k=12, the codeword length set to n=20, and the number of rows of parity check matrix H set to m=8, as with parity check matrix H shown in FIG. 6 and FIG. 8. Further, parity check matrix H shown in FIG. 10 is a matrix generated by setting period list P={4, 5} in Step S10.

As shown in FIG. 10, processor 50 generates each row in accordance with the procedure shown in FIG. 9 to satisfy conditions such that, when any two rows contained in parity check matrix H are selected, the two rows have periods that are relatively prime, or when the periods are identical, such that the two periods have different phases.

Accordingly, the occurrence of a common column in any two rows can be prevented, or the occurrence of a common column can be limited to just one. Alternatively, as shown in FIG. 10, partial matrix H2 within parity check matrix H is generated as a lower triangular matrix according to the procedure shown in FIG. 9.

Although an example is described in the present embodiment in which partial matrix H2 within parity check matrix H is a lower triangular matrix, the error-correcting characteristics are the same even when any rows or columns of parity check matrix H are substituted. For example, elements contained in parity check matrix H may be inverted vertically such that partial matrix H2 is an upper triangular matrix, and the meaning of the LDPC encoding is unchanged. Alternatively, the elements contained in parity check matrix H may be inverted horizontally such that the portion of m rows and m columns on the left side of parity check matrix H becomes a triangular matrix, and the meaning of LDPC encoding is unchanged.

In the present embodiment, by executing processing according to the procedure shown in FIG. 9, processor 50 generates parity check matrix H according to the following conditions. Period list P that is set in Step S100 is defined as $P=\{p(1), p(2), \ldots, p(PL)\}$, and $N(j)$ is defined as the sum of the values of the first to jth elements of period list P. In addition, $N(0)$ is defined as $N(0)=0$. When generation-target row number r satisfies the relation $N(j-1)+1 \leq r \leq N(j)$, processor 50 uses period variable $a=p(j)$ to generate row r such that matrix elements of columns c that satisfy the relations $1 \leq c \leq n-m+r$ and $c=p(j) \cdot i+n-m+r$ are "1" and other matrix elements are "0." In this case, "i" is an integer.

Although a case has been described in the present embodiment in which elements of columns c that satisfy the relations $1 \leq c \leq n-m+r$ and $c=p(j) \cdot i+n-m+r$ are set to "1" in Step S321, the conditions for setting elements to "1" is not limited to form shown in this embodiment. For example, when generation-target row number r satisfies the relation $N(j-1)+1 \leq r \leq N(j)$, processor 50 may use a prescribed value $F(j)$ determined using element number j of period list P to determine the elements that are to be set to "1." In such a case, processor 50 generates row r in Step S321 by setting to "1" matrix elements that are located in columns c that satisfy the relations $1 \leq c \leq n-m$ and $c=p(j) \cdot i+r+F(j)$ and columns c that satisfy the relation $c=n-m+r$, and setting the other matrix elements to "0." By adopting this method, the portion corresponding to H2 within parity check matrix H can be generated as a unit matrix.

As an example, $F(j)=-N(j-1)$ may be used as value $F(j)$ that is determined using element number j. Alternatively, $F(j)=n-m$ may be used. Although an example was described in the present embodiment in which only one period list is set in Step S110, the number of period lists that are set is not limited to one. For example, period list $Q=\{q(1), q(2), \ldots, q(QL)\}$ may be set in addition to period list P in Step S110. In this case, $M(j)$ may be defined as the sum of the values of the first to jth elements of list Q, and $M(0)$ may be defined as $M(0)=0$. Processor 50 may then use these two conditions to determine elements that are to be set to "1."

For example, when generation-target row number r satisfies the relation $N(j-1)+1 \leq r \leq N(j)$, processor 50 sets to "1" those matrix elements that are located in columns c that satisfy the relations $1 \leq c \leq n-m$ and $c=p(j) \cdot i+r+F(j)$ in Step S321. Further, when generation-target row number r satisfies the relation $M(j-1)+1 \leq r \leq M(j)$, processor 50 sets to "1"

those matrix elements that are located in columns c that satisfy the relations $n-m+1 \leq c \leq n-m+r$ and $c=q(j) \cdot i+n-m+r$, and then sets the other matrix elements to "0" to thus generate row r. $F(j)=-N(j-1)$ may be used as $F(j)$, or $F(j)=n-m$ may be used.

The plurality of elements of period list P may also be generated from a single parameter. For example, the elements of period list P may be defined as the smallest values of the values that satisfy the two conditions of being not only relatively prime, but also of being in a rising progression. By adopting this method, the determination of only leading element p1 as a parameter enables the determination of each element of the entirety of period list P. Alternatively, elements p(j) other than leading element p1 may each be defined as the smallest prime number of the prime numbers that are greater than the preceding element p(j−1) to thereby enable the determination of the entirety of period list P by determining only leading element p1.

Although an example was described in the present embodiment in which transmission line encoder generates parity check matrix H for use in LDPC encoding, the parity check matrix generation method may also be applied to a case in which transmission line decoder generates parity check matrix H for use in decoding codewords.

As described in the preceding explanation, according to the present embodiment, instead of being generated for each partial matrix, a parity check matrix can be generated as a group such that the conditions are satisfied that, when any two rows are selected, the two rows have periods that are relatively prime, or when the periods are identical, the two rows have phases that are different. Further, instead of generating each partial matrix, a parity check matrix can be generated as a group to contain a lower triangular matrix or a unit matrix. As a result, superior error-correcting characteristics can be realized in low-density parity-check codes, and a parity check matrix can be generated by a simple method. In addition, the cost of generating a generator matrix and cost of encoding can be decreased compared to a case in which the parity check matrix does not contain a lower triangular matrix or a unit matrix.

Fourth Embodiment

Explanation next regards the fourth embodiment of the present invention with reference to the accompanying figures. In the present embodiment, a data transmission system is described that applies any of the transmission line encoders and transmission line decoders shown in the first to third embodiments. The configuration of the data transmission system according to the present invention is identical to the configuration shown in FIG. 1. When data generator 10 generates a data string that is to be transmitted, the generated data string is supplied as output to transmission line encoder 11. In other words, data generator 10 supplies a generated data string to transmission line encoder 11.

Transmission line encoder 11 is equipped with any configuration for realizing the parity check matrix generation method described in the first to third embodiments. For example, a parity check matrix generation program for generating a parity check matrix is installed in transmission line encoder 11. Transmission line encoder 11 generates parity check matrix H based on period list P. Transmission line encoder 11 further uses parity check matrix H that has been generated to convert the data string that has been supplied from data generator 10 to codewords. Transmission line encoder 11 then transmits the codewords by way of transmission line 12 to transmission line decoder 13.

Transmission line decoder 13 is equipped with a configuration for realizing the parity check matrix generation method. For example, a parity check matrix generation program for generating a parity check matrix is installed in transmission line decoder 13. Transmission line decoder 13 generates parity check matrix H based on period list P. In addition, transmission line decoder 13 uses parity check matrix H that has been generated to restore the original data string from the received codewords in accordance with a sum-product decoding method. Transmission line decoder 13 then supplies the restored data string to data-consuming device 14. In other words, transmission line decoder 13 supplies the restored data string to data-consuming device 14.

Data-consuming device 14 consumes the data string that has been supplied from transmission line decoder 13. In other words, data-consuming device 14 processes the data string that has been supplied to perform display or output.

For example, when the data transmission system is a system for transmitting video data, data generator 10 is a video encoder, and the data string generated by data generator 10 is a bitstream. Data-consuming device 14 is a video decoder.

Transmission line encoder 11 and transmission line decoder 13 each use the same period list P. As a method of maintaining the unity of period list P, a method may be used for conferring the same period list P as an initial value to each of transmission line encoder 11 and transmission line decoder 13. Alternatively, when period list P is conferred by outside input, period list P that is applied as input from the outside may be reported to each of transmission line encoder 11 and transmission line decoder 13 following which each of transmission line encoder 11 and transmission line decoder 13 may use the reported period list P.

Alternatively, a method may be used in which transmission line encoder 11 sets period list P, following which transmission line encoder 11 transmits (reports) the period list P that has been set to transmission line decoder 13 by way of transmission line 12. In this case, the optimum values of period list P differ depending on the error-generation model of transmission line 12. Transmission line encoder 11 may transmit (report) the period list P with each transmission of codewords, or may transmit (report) period list P only when period list P is updated. When updating of period list P is carried out for each of predetermined prescribed time intervals, transmission line encoder 11 may transmit (report) period list P after updating to transmission line decoder 13 with each prescribed time interval.

Transmission line decoder 13 is the first to detect the error-occurrence state of transmission line 12, and transmission line decoder 13 may therefore carry out the settings of period list P. In this case, transmission line encoder 11 does not transmit period list P to transmission line decoder 13, but rather, transmission line decoder 13 transmits (reports) period list P to transmission line encoder 11 by way of transmission line 12.

When a definition has been adopted for generating each of the elements of period list P from a single parameter and each of the elements following a leading element can thus be determined based on the leading element of period list P, transmission line encoder 11 or transmission line decoder 13 may transmit (report) only the leading element. For example, a configuration is also possible in which, by defining the elements of period list P as the smallest values among the values that satisfy the two conditions that the elements not only be relatively prime, but further, that the elements be in a rising progression, each element of the entirety of period list P can be determined if only leading element p1 is determined. Alternatively, a configuration is possible in which, by defining elements p(j) other than the leading element p1 as each being the smallest prime number among prime numbers greater than the preceding element p(j−1), the entirety of period list P can be determined if only leading element p1 is determined.

When a change in the size of the parity check matrix is desired, transmission line encoder 11 may transmit (report) the number of rows and the number of columns of the parity check matrix following alteration to transmission line decoder 13 by way of transmission line 12. Alternatively, when a change of the size of the parity check matrix is desired, transmission line decoder 13 may transmit (report) the number of rows and the number of columns of the parity check matrix after alteration to transmission line encoder 11 by way of transmission line 12.

According to the present embodiment as described hereinabove, transmission line encoder 11 and transmission line decoder 13 in a data transmission system use any of the parity check matrix generation methods described in the first to third embodiments to generate a parity check matrix. Accordingly, superior error-correcting characteristics can be realized in low-density parity-check codes, and a parity check matrix can be generated by a simple method. In addition, the cost of generating a generator matrix and the cost of encoding can be reduced compared to a case in which the parity check matrix does not contain a lower triangular matrix or a unit matrix.

According to the present embodiment, a parity check matrix can be determined once the period list P or the leading element of period list P is known. As a result, if either one of transmission line encoder 11 and transmission line decoder 13 reports the period list P or the leading element to the other, transmission line encoder 11 and transmission line decoder 13 can share the same parity check matrix.

In addition, when the size of a parity check matrix is to be changed, if either one of transmission line encoder 11 and transmission line decoder 13 reports the matrix size to the other, the size of the parity check matrix can be easily altered. Accordingly, the optimum parity check matrix for transmission at the time of data transmission can be easily used even in the event of changes in the characteristics of transmission line 12 or the state of congestion of a packet exchange network.

POTENTIAL FOR USE IN THE INDUSTRY

The parity check matrix generation method according to the present invention can be applied when a transmission line encoder included in a data transmission system generates a parity check matrix used for LDPC encoding of a data string. The parity check matrix generation method can also be applied when a transmission line decoder included in a data transmission system generates a parity check matrix for use in decoding codewords that have been received.

The invention claimed is:

1. A parity check matrix generation method comprising:
generating row r (where $1 \leq r \leq m$) of a parity check matrix of m rows and n columns using a period list P={p(1), p(2), . . . , p(PL)}, where any two periods in the period list are relatively prime;
determining positions of matrix elements "1" at columns c ($1 \leq c \leq n-m+r$ and c=p(j)·i+r−N(j−1), where p(j) is the jth element of the period list and i=0 or a negative integer) of row r of the parity check matrix if N(j−1)+1$\leq r \leq$N(j), wherein N(j) is defined as a sum of values from element p(1) to element p(j) of said period list P and N(0) is defined as "0" and wherein all the positions of matrix elements of the parity check matrix that are not determined as "1" are assigned a value of "0"; and
generating the parity check matrix of m rows and n columns in a low density parity check code,
wherein a processor generates the parity check matrix.

2. A parity check matrix generation method comprising:
generating row r (where $1 \leq r \leq m$) of a parity check matrix of m rows and n columns using a period list P={p(1), p(2), . . . , p(PL)}, where any two periods in the period list are relatively prime;
determining positions of matrix elements "1" at columns c ($1 \leq c \leq n-m+r$ and c=p(j)·i+r+n−m, where p(j) is the jth element of the period list and i=0 or a negative integer) of row r of the parity check matrix if N(j−1)+1$\leq r \leq$N(j), wherein N(j) is defined as a sum of values from element p(1) to element p(j) of said period list P and N(0) is defined as "0" and wherein all the positions of matrix elements of the parity check matrix that are not determined as "1" are assigned a value of "0"; and
generating the parity check matrix of m rows and n columns in a low density parity check code,
wherein a processor generates the parity check matrix.

3. A parity check matrix generation method comprising:
generating row r (where $1 \leq r \leq m$) of a parity check matrix of m rows and n columns using a first period list P={p(1), p(2), . . . , p(PL)} and a second period list Q={q(1), q(2), . . . , q(QL)}, where any two periods in the first period list and the second period list are relatively prime;
determining positions of matrix elements "1" at columns c ($1 \leq c \leq n-m+r$ and c=p(j)·i+r+n−m, where p(j) is the jth element of the period list P and i=0 or a negative integer) of row r of the parity check matrix if N(j−1)+1$\leq r \leq$N(j), wherein N(j) is defined as a sum of values from element p(1) to element p(j) of said period list P and N(0) is defined as "0";
determining positions of matrix elements "1" at columns d ($1 \leq d \leq n-m+r$ and d=q(j)·i+r+n−m, where q(j) is the jth element of the period list Q and i=0 or a negative integer) of row r of the parity check matrix if M(j−1)+1$\leq r \leq$M(j), wherein M(j) is defined as a sum of values from element q(1) to element q(j) of said period list Q and M(0) is defined as "0", assigning a value of "0" to all the positions of matrix elements of the parity check matrix that are not determined as "1"; and
generating the parity check matrix of m rows and n columns in a low density parity check code,
wherein a processor generates the parity check matrix.

4. The parity check matrix generation method according to claim 1, claim 2 or claim 3, wherein period list P is determined by generating elements from element p(2) to element p(PL) based on leading element p(1).

5. The parity check matrix generation method according to claim 4, wherein elements p(j) of period list P are generated such that elements p(j) are the smallest values among values that satisfy a condition of being relatively prime with all preceding elements from element p(1) to element p(j−1).

6. The parity check matrix generation method according to claim 4, wherein elements p(j) of period list P are generated such that elements p(j) are the smallest values among values that each satisfy a condition of being a prime number greater than preceding element p(j−1).

7. The parity check matrix generation method according to claim 2, wherein period list P is determined by generating elements from element p(2) to element p(PL) based on leading element p(1).

8. The parity check matrix generation method according to claim 3, wherein period list P is determined by generating elements from element p(2) to element p(PL) based on leading element p(1).

9. An encoding device which:

generates row r (where $1 \leq r \leq m$) of a parity check matrix of m rows and n columns using a period list P={p(1), p(2), ..., p(PL)}, where any two periods in the period list are relatively prime;

determines positions of matrix elements "1" at columns c ($1 \leq c \leq n-m+r$ and $c=p(j) \cdot i+r-N(j-1)$, where p(j) is the jth element of the period list and i=0 or a negative integer) of row r of the parity check matrix if $N(j-1)+1 \leq r \leq N(j)$, wherein N(j) is defined as a sum of values from element p(1) to element p(j) of said period list P and N(0) is defined as "0" and wherein all the positions of matrix elements of the parity check matrix that are not determined as "1" are assigned a value of "0";

generates the parity check matrix of m rows and n columns in a low density parity check code;

performs low-density parity encoding, using the generated parity check matrix, to convert data to codewords; and transmits the converted codewords to a decoding device by way of a transmission line.

10. An encoding device which:

generates row r (where $1 \leq r \leq m$) of a parity check matrix of m rows and n columns using a period list P={p(1), p(2), ..., p(PL)}, where any two periods in the period list are relatively prime;

determines positions of matrix elements "1" at columns c ($1 \leq c \leq n-m+r$ and $c=p(j) \cdot i+r+n-m$, where p(j) is the jth element of the period list and i=0 or a negative integer) of row r of the parity check matrix if $N(j-1)+1 \leq r \leq N(j)$, wherein N(j) is defined as a sum of values from element p(1) to element p(j) of said period list P and N(0) is defined as "0" and wherein all the positions of matrix elements of the parity check matrix that are not determined as "1" are assigned a value of "0";

generates the parity check matrix of m rows and n columns in a low density parity check code;

performs low-density parity encoding, using the generated parity check matrix, to convert data to codewords; and transmits the converted codewords to a decoding device by way of a transmission line.

11. An encoding device which:

generates row r (where $1 \leq r \leq m$) of a parity check matrix of m rows and n columns using a first period list P={p(1), p(2), ..., p(PL)} and a second period list Q={q(1), q(2), ..., q(QL)}, where any two periods in the first period list and the second period list are relatively prime;

determines positions of matrix elements "1" at columns c ($1 \leq c \leq n-m+r$ and $c=p(j) \cdot i+r+n-m$, where p(j) is the jth element of the period list P and i=0 or a negative integer) of row r of the parity check matrix if $N(j-1)+1 \leq r \leq N(j)$, wherein N(j) is defined as a sum of values from element p(1) to element p(j) of said period list P and N(0) is defined as "0";

determining positions of matrix elements "1" at columns d ($1 \leq d \leq n-m+r$ and $d=q(j) \cdot i+r+n-m$, where q(j) is the jth element of the period list Q and i=0 or a negative integer) of row r of the parity check matrix if $M(j-1)+1 \leq r \leq M(j)$, wherein M(j) is defined as a sum of values from element q(1) to element q(j) of said period list Q and M(0) is defined as "0", assigns a value of "0" to all the positions of matrix elements of the parity check matrix that are not determined as "1";

generates the parity check matrix of m rows and n columns in a low density parity check code;

performs low-density parity encoding, suing the generated parity check matrix, to convert data to codewords; and transmits the converted codewords to a decoding device by way of a transmission line.

12. A decoding device which:

receives codewords from an encoding device by way of a transmission line;

generates row r (where $1 \leq r \leq m$) of a parity check matrix of m rows and n columns using a period list P={p(1), p(2), ..., p(PL)}, where any two periods in the period list are relatively prime;

determines positions of matrix elements "1" at columns c ($1 \leq c \leq n-m+r$ and $c=p(j) \cdot i+r-N(j-1)$, where p(j) is the jth element of the period list and i=0 or a negative integer) of row r of the parity check matrix if $N(j-1)+1 \leq r \leq N(j)$, wherein N(j) is defined as a sum of values from element p(1) to element p(j) of said period list P and N(0) is defined as "0" and wherein all the positions of matrix elements of the parity check matrix that are not determined as "1" are assigned a value of "0";

generates the parity check matrix of m rows and n columns in a low density parity check code;

decodes, using the generated parity check matrix, said received codewords; and converts to data that preceded encoding.

13. A decoding device which:

receives codewords from an encoding device by way of a transmission line;

generates row r (where $1 \leq r \leq m$) of a parity check matrix of m rows and n columns using a period list P={p(1), p(2), ..., p(PL)}, where any two periods in the period list are relatively prime;

determines positions of matrix elements "1" at columns c ($1 \leq c \leq n-m+r$ and $c=p(j) \cdot i+r+n-m$, where p(j) is the jth element of the period list and i=0 or a negative integer) of row r of the parity check matrix if $N(j-1)+1 \leq r \leq N(j)$, wherein N(j) is defined as a sum of values from element p(1) to element p(j) of said period list P and N(0) is defined as "0" and wherein all the positions of matrix elements of the parity check matrix that are not determined as "1" are assigned a value of "0";

generates the parity check matrix of m rows and n columns in a low density parity check code;

decodes, using the generated parity check matrix, said received codewords; and converts to data that preceded encoding.

14. A decoding device which:

receives codewords from an encoding device by way of a transmission line;

generates row r (where $1 \leq r \leq m$) of a parity check matrix of m rows and n columns using a first period list P={p(1), p(2), ..., p(PL)} and a second period list Q={q(1), q(2), ..., q(QL)}, where any two periods in the first period list and the second period list are relatively prime;

determines positions of matrix elements "1" at columns c ($1 \leq c \leq n-m+r$ and $c=p(j) \cdot i+r+n-m$, where p(j) is the jth element of the period list P and i=0 or a negative integer) of row r of the parity check matrix if $N(j-1)+1 \leq r \leq N(j)$, wherein N(j) is defined as a sum of values from element p(1) to element p(j) of said period list P and N(0) is defined as "0";

determining positions of matrix elements "1" at columns d ($1 \leq d \leq n-m+r$ and $d=q(j) \cdot i+r+n-m$, where q(j) is the jth element of the period list Q and i=0 or a negative integer) of row r of the parity check matrix if $M(j-1)+1 \leq r \leq M(j)$, wherein M(j) is defined as a sum of values from element q(1) to element q(j) of said period list Q and M(0) is defined as "0", assigns a value of "0" to all the positions of matrix elements of the parity check matrix that are not determined as "1";

generates the parity check matrix of m rows and n columns in a low density parity check code;

decodes, using the generated parity check matrix, said received codewords; and converts to data that preceded encoding.

* * * * *

UNITED STATES PATENT AND TRADEMARK OFFICE
CERTIFICATE OF CORRECTION

| | |
|---|---|
| PATENT NO. | : 7,908,539 B2 |
| APPLICATION NO. | : 12/436589 |
| DATED | : March 15, 2011 |
| INVENTOR(S) | : Yuzo Senda |

It is certified that error appears in the above-identified patent and that said Letters Patent is hereby corrected as shown below:

In the Specification

Column 6, Line 2: delete "N(j)" and insert -- N(0) --
Column 6, Line 30: delete "N(j)" and insert -- N(0) --
Column 6, Line 35: delete "M(j)" and insert -- M(0) --
Column 9, Line 25: delete "N(j)" and insert -- N(0) --
Column 9, Line 55: delete "N(j)" and insert -- N(0) --
Column 10, Line 18: delete "N(j)" and insert -- N(0) --
Column 10, Line 24: delete "M(j)" and insert -- M(0) --
Column 12, Line 42: delete "S10," and insert -- S110, --
Column 14, Line 22: delete "p1" and insert -- pi --
Column 14, Line 37: delete "S10." and insert -- S110. --
Column 16, Line 25: delete "p1" and insert -- pi --
Column 17, Line 64: delete "S10." and insert -- S110. --
Column 18, Line 26: delete "S100" and insert -- S110 --

In the Claims

Column 24, Line 5: In Claim 11, delete "suing" and insert -- using --

Signed and Sealed this
Eleventh Day of March, 2014

Michelle K. Lee
*Deputy Director of the United States Patent and Trademark Office*